US 6,721,354 B1

(12) United States Patent
Chouly et al.

(10) Patent No.: US 6,721,354 B1
(45) Date of Patent: Apr. 13, 2004

(54) METHOD OF SEARCHING THE POINT WHICH IS THE NEAREST FROM A CHARACTERISTIC OF A RECEIVED SIGNAL IN AN ASSEMBLY OF NON-UNIFORMLY DISTRIBUTED POINTS

(75) Inventors: Antoine Chouly, Paris (FR); Véronique Brun, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/390,852

(22) Filed: Sep. 7, 1999

(30) Foreign Application Priority Data

Sep. 8, 1998 (FR) .............................................. 98 11182

(51) Int. Cl.[7] .......................... H04B 13/02; H04L 5/16
(52) U.S. Cl. ...................................... 375/222; 375/242
(58) Field of Search ................................ 375/222, 265, 375/298, 242, 341, 286, 243, 233, 247, 248; 370/320, 465; 703/2; 341/138

(56) References Cited

U.S. PATENT DOCUMENTS

| 4,143,363 | A |   | 3/1979 | Dotter ........................ 340/347 |
| 5,604,772 | A | * | 2/1997 | Botto et al. .................. 375/341 |
| 5,619,540 | A | * | 4/1997 | Moridi et al. ................ 375/341 |
| 6,198,776 | B1 | * | 3/2001 | Eyuboglu et al. ........... 375/286 |
| 6,373,889 | B1 | * | 4/2002 | Alelyunas et al. .......... 375/233 |
| 6,421,388 | B1 | * | 7/2002 | Parizhsky et al. .......... 375/243 |

* cited by examiner

Primary Examiner—Stephen Chin
Assistant Examiner—Curtis Odom

(57) ABSTRACT

The invention proposes an efficient method of determining, in an arbitrary assembly of non-uniformly distributed points, the point which is nearest from a characteristic of a given analog signal. It is particularly applicable to the detection of symbols in a PCM modem. The method comprises the step of considering successive search intervals, each search interval being obtained by splitting up a preceding search interval into two intervals, each interval comprising a number of points, the numbers being equal or different by one, such that one of these two intervals which comprises the received point constitutes the next search interval.

5 Claims, 4 Drawing Sheets

METHOD OF SEARCHING THE POINT WHICH IS THE NEAREST FROM A CHARACTERISTIC OF A RECEIVED SIGNAL IN AN ASSEMBLY OF NON-UNIFORMLY DISTRIBUTED POINTS

FIELD OF THE INVENTION

The invention relates to a method of searching, in an assembly of non-uniformly distributed points, the point which is the nearest from of a characteristic of a given analog signal. The invention also relates to a receiver comprising means for receiving an analog signal, and decoding means for selecting, in an assembly of non-uniformly distributed points, the point which is the nearest from a characteristic of the received signal. The invention further relates to a transmission system comprising such a receiver.

The invention finds important applications, notably in modems of the PCM (Pulse Code Modulation) type, and particularly in modems conforming to the recommendation V.90 of the ITU (International Telecommunication Union).

BACKGROUND OF THE INVENTION

U.S. Pat. No. 4,143,363 describes a method of determining the quantization level associated with an analog signal by applying a segmented linear logarithmic compression law. This method comprises the step of determining, from an assembly of non-uniformly distributed levels, the level which is the nearest from the amplitude of the received analog signal. The proposed method takes certain properties of the compression law into account: particularly it takes account of the fact that the linear segments each comprise the same number of points.

This is a specific method which is connected with the law of distributing points in the assembly considered. Particularly, it is not applicable to the detection of symbols received by a VPCM modem because the constellations used by the PCM modems only comprise certain points of a law for segmented linear logarithmic compression.

SUMMARY OF THE INVENTION

The invention notably has for its object to provide an efficient method of determining, in an arbitrary assembly of non-uniformly distributed points, the point which is the nearest from a characteristic of a given analog signal.

This object is achieved by means of a method as defined in claim 1 of this application. The proposed solution consists of effectuating a dichotomy on the number of points comprised in the search interval. It is independent of the law of distributing points in the considered search assembly.

BRIEF DESCRIPTION OF THE DRAWINGS

These and other aspects of the invention are apparent from and will be elucidated, by way of non-limitative example, with reference to the embodiment(s) described hereinafter.

In the drawings.

DESCRIPTION OF PREFERRED EMBODIMENTS

The PCM modems allow interconnection of a user A connected to a transmission network via an analog connection and a user B connected to the same network via a digital connection. These may be, for example, a user terminal A communicating with a server B of a service provider.

Figure 1:
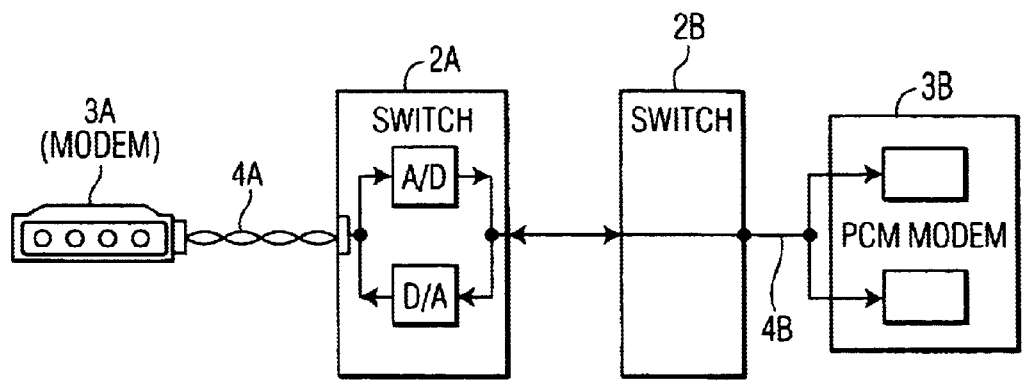
FIG. 1 shows an embodiment of the transmission system according to the invention.

FIG. 1 shows an embodiment of such a transmission system. The transmission system of FIG. 1 comprises a digital telecommunication network 1 having two switches 2A and 2B. A PCM modem 3A is connected to the switch 2A by means of a twisted pair 4A for transmitting analog signals. A PCM modem 3B is connected to the switch 2B by means of a digital connection 4B, for example, an ISDN connection. This digital connection 4B may be considered as an extension of the digital transmission network: the switch 2B thus plays the role of a repeater.

In conformity with the recommendation V.90, the PCM modems use constellations constituted by points of a law of segmented linear logarithmic compression, known as the A-law or $\mu$-law. These selected points in the law are referred to as constellation symbols.

The segmented linear logarithmic A-laws or $\mu$-laws were originally introduced in A/D and D/A converters of digital switches of telephone networks for speech transmission. They allow a non-uniform quantization of the amplitude of the signal to be transmitted so as to guarantee a constant signal-to-noise ratio independent of the considered amplitude (the quantization levels are closer together as the origin is approached).

Figure 2:
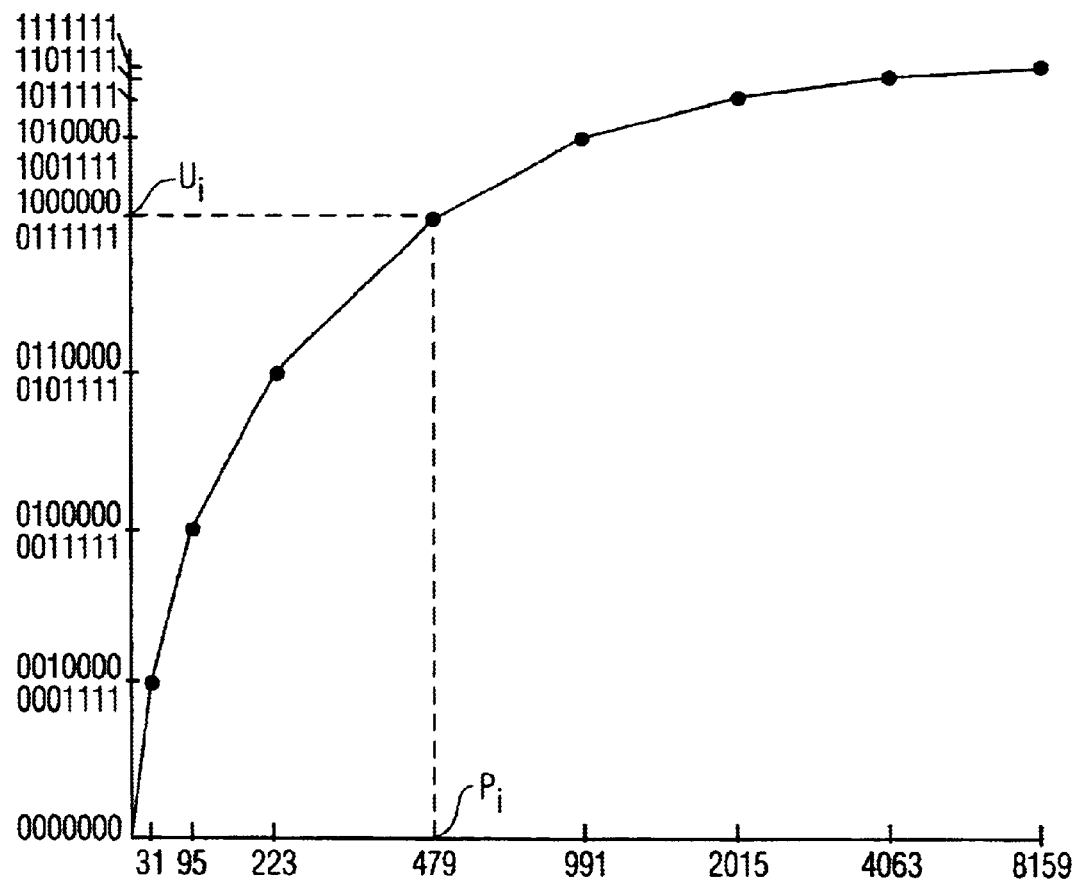
FIG. 2 shows a logarithmic compression law.

The positive part of a $\mu$-law has been diagrammatically shown, by way of example, in FIG. 2. It consists of 8 segments each comprising 16 quantization levels. A point $P_i$ is associated by the $\mu$-law with each quantization level $U_i$.

Generally, the symbols of a constellation must be sufficiently spaced so as to allow detection of symbols received with an acceptable error rate. The detection errors are more sensitive to the data than to speech (a detection error means the restitution of an erroneous data, while a speech detection error means an error in the restituted sound level). In particular it is not possible to use all the points of the A-law or $\mu$-law (adapted to speech transmission) for forming a constellation used by modems for transmitting data. It is for this reason that only certain points of the A-law or $\mu$-law are selected for forming the constellations used by the VPCM modems.

Figure 3:
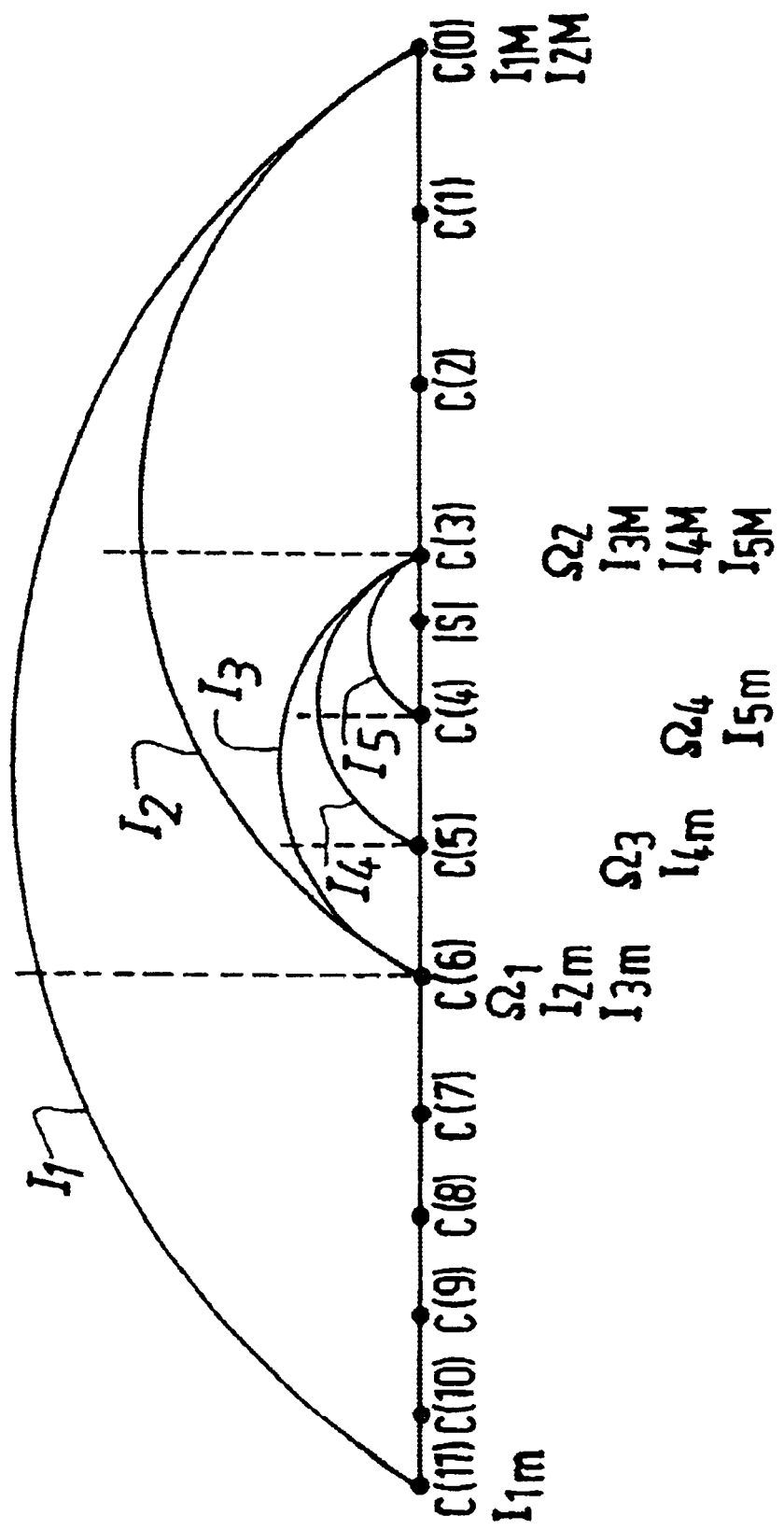
FIG. 3 shows an embodiment of the constellation used by PCM modems.

FIG. 3 shows an embodiment of the constellation that can be used for PCM modems. For the sake of simplicity, the constellation is limited to 12 amplitude symbols C(i) with i=0, ..., 11. The constellation is organized in a descending order, i.e. the smallest index i=0 refers to the point in the constellation having the largest amplitude C(0).

In a descending transmission from B to A, the modem B emits binary words. Each emitted binary word $U_i$ is associated with a symbol of the constellation used. These binary words are received by the converter 2A and converted into analog signals by applying an inverse expansion law for said compression law. The analog signals thus formed are transmitted through the connection 4A. For each received signal, the modem A must retrieve, in the constellation used, the symbol which is the nearest from the amplitude of the received signal, i.e. the index p which verifies:

$$\|C(p)-\|S\|\|=\text{Min}_{i\in\{0,\ldots,k-1\}}\|C(i)-\|S\|\|$$

where k is the number of symbols of the constellation and $|S|$ is the amplitude of the received signal.

In accordance with the invention, successive search intervals $I_j$ centered at $|S|$ are considered. The search interval $I_{j+1}$ is obtained by dividing the search interval $I_j$ into two intervals each comprising a number of symbols said numbers of points being equal or different by one. The interval $I_{j+1}$ is that one of the two obtained intervals which comprises the amplitude point $|S|$.

Figure 4:
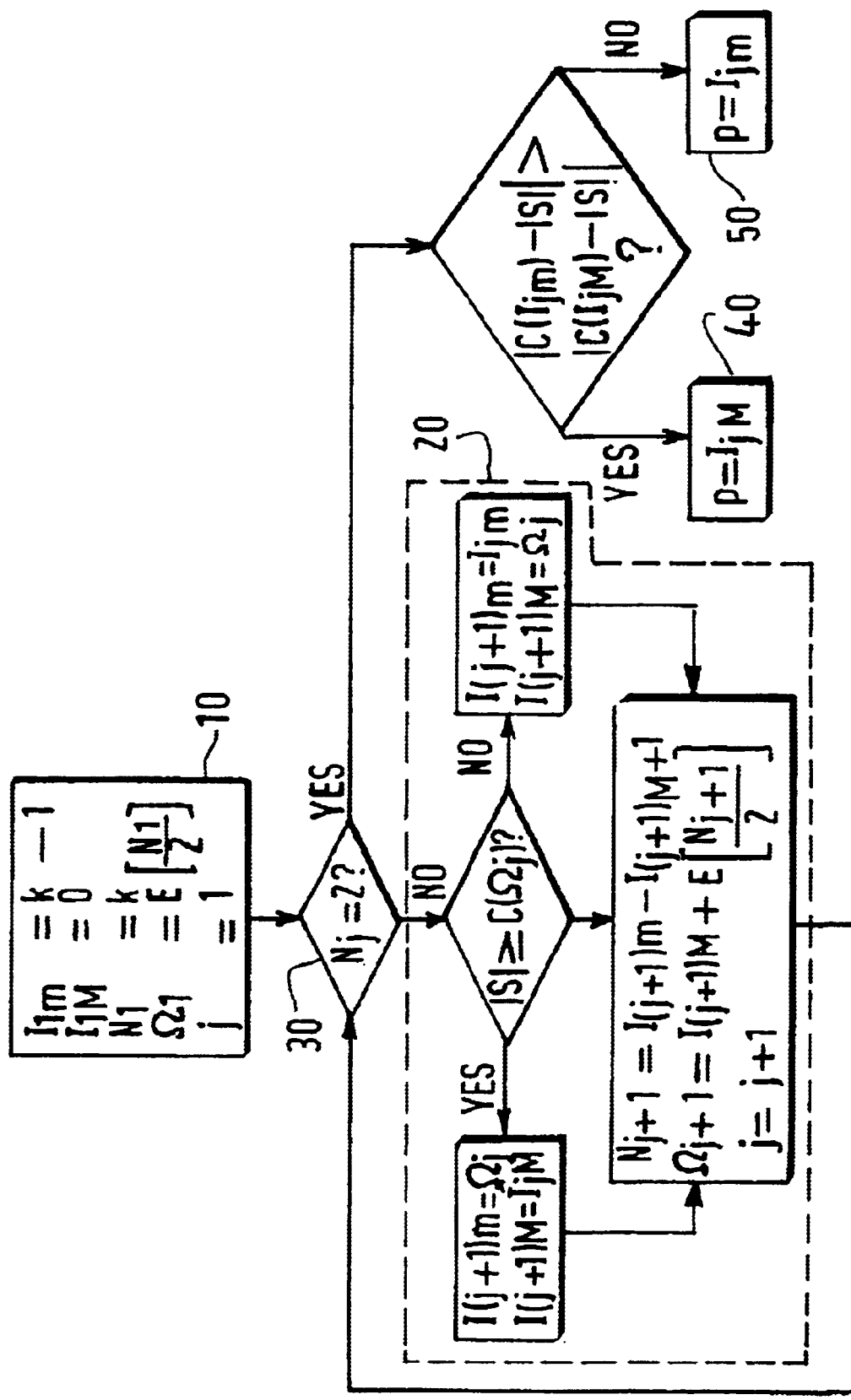
FIG. 4 shows an organogram of an embodiment of the method according to the invention.

An embodiment of the search method according to the invention will now be described with reference to FIG. 4. To this end: a search interval $I_j$ is defined by the index jm of the symbol having the lowest amplitude C(jm) comprised in $I_j$, and by the index jM of the symbol having the largest amplitude C(jM) comprised in $I_j$:

$$I_j=[C(jm),C(jM)] \text{ with } jm>jM$$

$N_j$ is the number of constellation symbols comprised in the search interval $I_j$, $\Omega_j$ is the index of the symbol considered as the central symbol for dividing the search interval $I_j$ into two. $\Omega_j$ is chosen to be $E(N_j/2)$ so as to have the same number of symbols in the two intervals when this is possible, i.e. when $N_j$ is even. When $N_j$ is odd, one of the two intervals will comprise one symbol more than the other.

The search method is initialized with the following values (case 10):

$$I_{1m}=k-1, I_{1M}=0, N_1=k, \Omega_1=E(N_1/2).$$

The successive search intervals are then obtained in the following manner for $j \geq 1$ (case 20):

$$|S| \geq C(\Omega_j) \Rightarrow \begin{cases} I_{j+1} = [C(I_{(j+1)m}), C(I_{(j+1)M})] = [C(\Omega_j), C(I_{jM})] \\ Nj = I_{(j+1)m} - I_{(j+1)M} + 1 = \Omega_j - I_{jM} + 1 \\ \Omega_{j+1} = I_{(j+1)M} + E\left[\frac{N_{j+1}}{2}\right] = I_{jM} + E\left[\frac{N_{j+1}}{2}\right] \end{cases}$$

$$|S| < C(\Omega_j) \Rightarrow \begin{cases} I_{j+1} = [C(I_{(j+1)m}), C(I_{(j+1)M})] = [C(I_{jm}), C(\Omega_j)] \\ Nj = I_{(j+1)m} - I_{(j+1)M} + 1 = I_{jm} - \Omega_j + 1 \\ \Omega_{j+1} = I_{(j+1)M} + E\left[\frac{N_{j+1}}{2}\right] = \Omega_j + E\left[\frac{N_{j+1}}{2}\right] \end{cases}$$

When the search interval obtained comprises not more than two symbols ($N_j=2$; case 30), the search index p is the index of the symbol whose amplitude is most proximate to $|S|$:

if $|C(I_{jm})-|S||>|C(I_{jM})-|S||$ then $p=I_{jM}$ (case 40)

if not, $p=I_{jm}$ (case 50).

FIG. 3 shows the successive search intervals $I_1$ to $I_5$ which are necessary for determining the index p=3 of the symbol whose amplitude C(3) is the nearest from the amplitude $|S|$ of the received signal.

Figure 5:
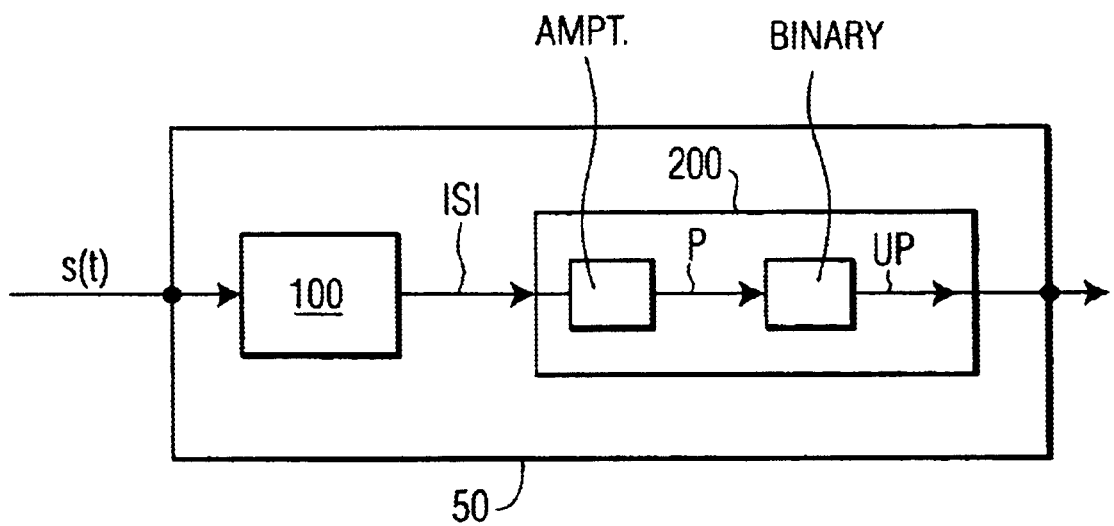
FIG. 5 is a block diagram of an embodiment of the receiver according to the invention.

FIG. 5 shows, by way of example, a block diagram of an embodiment of the receiver 50 according to the invention. It comprises conventional means 100 for receiving analog signals and decoding means 200 for selecting, in the constellation, the symbol C(p) which is the nearest in amplitude from the received signal, and for determining the binary sequence $U_p$ transmitted by the transmitter 3B, which corresponds to this symbol in conformity with the logarithmic law used. Advantageously, these decoding means 200 are constituted by conventional storage and computing means.

Although the invention has been described within the scope of the V.90 standard, it is not limited to this standard. Generally, it is applicable to the search of the point which is the nearest from of a characteristic of a received signal in an assembly of non-uniformly distributed points. The law for distributing the points may be arbitrary.

What is claimed is:

1. A method of searching, in an assembly of non-uniformly distributed points (C(i), i=0, ..., k−1), the point which is the nearest from a characteristic ($|S|$) of a given analog signal, comprising the steps of:

considering successive search intervals ($I_j$) in the assembly, and wherein a first interval is determined using a lowest and highest amplitude points, and in successive search intervals, splitting up a previous search interval into two intervals, each of the two intervals including a respective number of points, the respective number of points being equal or different by one.

2. A receiver comprising:

means for receiving an analog signal; and a decoder arranged to select, in an assembly of non-uniformly distributed points, the point which is the nearest from a characteristic of the received analog signal, said decoder being configured for elaborating successive search intervals ($I_j$) in the assembly, wherein a first interval is determined using a lowest and highest amplitude points, and the successive search intervals being obtained by splitting up a previous search interval into two intervals, each of the two intervals including a respective number of points, the respective number of points being equal or different by one.

3. A receiver as claimed in claim 2, further comprising means for determining a point, referred to as central point of a search interval, from the entire part of half the number of points comprised in the interval.

4. A modem comprising:

means for receiving analog signals; and means for decoding the received analog signals, said decoding means comprising means for selecting, in an assembly of non-uniformly distributed points, the point which is the nearest from the amplitude of the received analog signal, wherein a first interval is determined using a lowest and highest amplitude points, and wherein said selection means includes means for elaborating successive search intervals in the assembly, the successive search intervals being obtained by splitting up a previous search interval into two intervals, each interval including a respective number of points, the respective number of points being equal or different by one.

5. A transmission system comprising:

at least a transmitter: and a receiver for receiving analog signals, the receiver including decoding means for selecting, in an assembly of non-uniformly distributed points, the point which is the nearest from a characteristic of the received signal, wherein a first interval is determined using a lowest and highest amplitude points, and wherein said decoding means includes means for elaborating successive search intervals in the assembly, the successive search intervals being obtained by splitting up a previous search interval into two intervals, each interval including a respective number of points, the respective number of points being equal or different by one.

* * * * *